United States Patent [19]

Voss

[11] 3,999,211
[45] Dec. 21, 1976

[54] THYRISTOR

[75] Inventor: Peter Voss, Munich, Germany

[73] Assignee: Siemens Aktiengesellschaft, Munich, Germany

[22] Filed: May 8, 1975

[21] Appl. No.: 575,665

[30] Foreign Application Priority Data

May 10, 1974 Germany ............... 2422748

[52] U.S. Cl. .............. 357/38; 357/20; 357/60; 357/65
[51] Int. Cl.² ................. H01L 29/74
[58] Field of Search ........... 357/38, 39, 60, 20, 357/65

[56] References Cited

UNITED STATES PATENTS

| | | | |
|---|---|---|---|
| 3,344,323 | 9/1967 | Einthoven et al. | 357/38 |
| 3,585,714 | 9/1968 | Li | 357/60 |
| 3,761,785 | 9/1973 | Pruniaux | 357/60 |

FOREIGN PATENTS OR APPLICATIONS

| | | | |
|---|---|---|---|
| 1,234,326 | 2/1967 | Germany | 357/38 |
| 45-32725 | 10/1970 | Japan | 357/60 |

*Primary Examiner*—Michael J. Lynch
*Assistant Examiner*—Joseph E. Clawson, Jr.
*Attorney, Agent, or Firm*—C. L. Menzemer

[57] ABSTRACT

A semiconductor switching device is described in which a control electrode is disposed on a base zone adjacent to an emitter zone. The control electrode has at least one straight edge portion parallel to an adjacent straight border edge portion of the emitter zone. The parallel edges are also parallel to a [110] crystallographic direction of the semiconductor crystal which has a <111> crystal orientation; thus providing optimum firing of the device.

5 Claims, 5 Drawing Figures

THYRISTOR

BACKGROUND OF THE INVENTION

1. Field of the Invention

The present invention relates to semiconductor switching devices and more particularly to thyristors.

2. Description of the Prior Art

In order to produce thyristors having high values of $di/dt$ a form of construction is required which allows the firing process to spread rapidly. Among other things, the spreading of the firing process is determined by the position and form of the thyristor's control electrode.

In German Pat. No. 1,234,326, a thyristor is described which has a strip-like control electrode laying in a strip-shaped recess in the emitter electrode. The control electrode and the recess in the emitter electrode each have two parallel edges. In addition, they are arranged so that the control electrode is positioned at a first constant distance from the emitter zone and a second constant distance from the edge of the recess in the emitter electrode.

Experiments carried out with thyristors in which the control electrode is a constant distance from the edge of the emitter have shown that firing sets-in mainly at specific locations determined by the crystal orientation. Initially, these locations are very small causing a concentration of load current under certain conditions. The resulting overheating can lead to the destruction of the thyristor.

FIG. 1 illustrates the specific locations where firing occurs for the case where a semiconductor body 9 was made from a semiconductor crystal rod drawn from the melt in the <111> direction. A control electrode 8 contacts the semiconductor body 9 in a ring-shaped interior base portion 2 which is bordered by an emitter portion 1. The border edge 12 of the emitter 1 intersects the surface of the semiconductor body 9 in circular shaped line. Experiments using infrared imaging show that concentrated firing takes place at specific locations 14 which lie approximately parallel to the [0$\bar{1}$1], [$\bar{1}$10] and [10$\bar{1}$] directions.

SUMMARY OF THE INVENTION

The present invention concerns a semiconductor switching device comprising a monocrystalline body of semiconductor material and a plurality of electrodes. The body comprises an emitter zone of a given semiconductivity and an adjacent base zone of opposite type semiconductivity with a PN junction at the interface between the zones. The PN junction emerges as a straight line at at least one portion of the surface of the body. The emitter zone is contacted by an emitter electrode which has at least one straight edge parallel to the straight line formed by the PN junction. The base zone is contacted by a control electrode also having at least one straight edge parallel to the straight line and in close proximity to the straight line. The shortest separation distance between any point on the control electrode and any point in the emitter zone is the distance separating the straight edge of the control electrode and the straight line which borders the emitter zone. One purpose of this construction is to spread out the firing area as much as possible.

An especially simple construction is provided by a semicircular-shaped border of the emitter zone emerging at the surface of the body. The control electrode is rectangular and contacts the surface of the body within the semicircle. Another embodiment, which increases the spread of firing, comprises a control electrode in the form of a 60° sector of a circle lying within a similarly shaped emitter zone border. The relative position of the two sectors is such that the straight edges are spaced at one distance which is less than the spacing between the curved edges.

A further spreading of the firing area can be obtained by an embodiment in the form of three equilateral triangles disposed symmetrically. The control electrode forms the innermost triangle, which is surrounded by the border of the emitter zone, which in turn is surrounded by the inside edge of the emitter electrode. Each edge of the control electrode is equidistant from the respective parallel borders of the emitter zone. For each of the above preferred embodiments, the turn-on delay time can be minimized by orienting the straight edges parallel to the [110] crystallographic directions of a semiconductor body drawn in one of the <111> directions.

DESCRIPTION OF THE PREFERRED EMBODIMENTS

Figure 2:
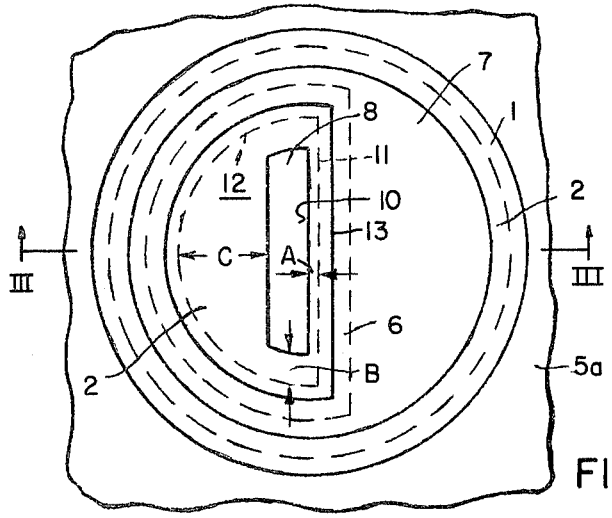
FIG. 2 is a partial plan view of an embodiment of the present invention.
Figure 3:
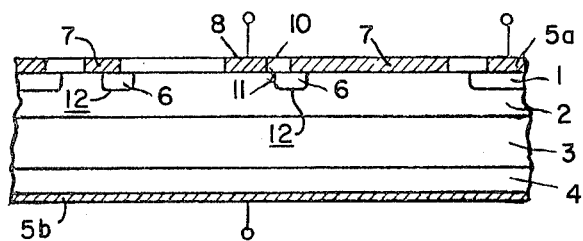
FIG. 3 is a vertical cross sectional view of the embodiment of FIG. 2 taken along line 3—3.

FIGS. 2 and 3 illustrate partial views of a semiconductor switching device—in this case specifically a thyristor. The thyristor comprises four zones of alternate conductivity type, formed by doping the semiconductor body with impurities in a known manner. The four zones consist of an emitter zone 1 at the top of the semiconductor body, a base zone 2 located primarily under the emitter zone 1 and having portions extending past the emitter zone 1 to the top of the semiconductor body, another zone 3 below the base zone 2, and an anode zone 4 below the zone 3. An emitter contact 5a is joined to the emitter zone 1 and an anode contact 5b is joined to the anode zone 4. Within the semiconductor body there is an auxiliary emitter zone 6 disposed within the emitter zone 1, and separated from the emitter zone 1 by the base zone 2. At the top of the semiconductor body is disposed an auxiliary emitter electrode 7 in contact with the auxiliary emitter 6. A control electrode 8 contacts the top of the semiconductor body at a portion of the base zone 2 within the auxiliary emitter zone 6 and within a recess of the auxiliary emitter electrode 7. The auxiliary emitter 6 forms a PN junction interface 12 with base zone 2. A straight line portion 11 of interface 12 lies between the control electrode 8 and the auxiliary emitter electrode 7 at the top surface of the semiconductor body.

A straight edge 10 of the control electrode 8 is parallel to the straight line portion 11 of interface 12, line 11 in turn being parallel to the edge 13 of the recessed auxiliary emitter electrode 7. The interface 12 and edge 13 form semicircles at the surface of the semiconductor body. The straight line portion 11 and straight edge 10 are separated by a distance designated by A. The distance A is the shortest separation distance between the control electrode 8 and the auxiliary emitter 6. For example, the distance A is less than each of the distances designated by B and C.

In the arrangement of FIG. 2, uniform firing takes place along those portions of line 11 separated from edge 10 by the distance A. All points along the parallel edge 10 and line 11 share the same crystallographic orientation resulting in uniform firing along line 11. Such line-shaped firing reduces local heating present in prior art devices, thus damage is not done to the thyristor by overloading. Since distances B and C are greater than distance A, essentially no firing occurs along the remaining portions of the PN junction interface 12, the greater distances causing a relative disadvantage in the firing process.

Figure 1:
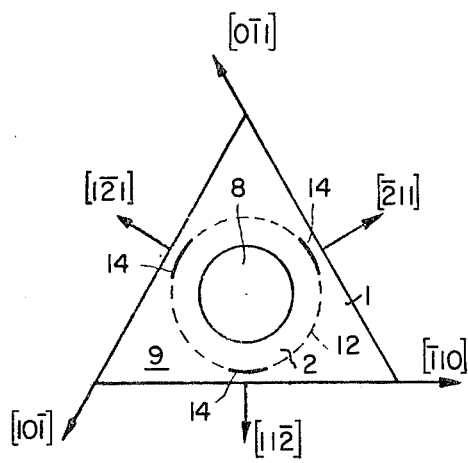
FIG. 1 is a schematic plan view of a device of the prior art.

The crystallographic orientation plays no part in the initial firing of the main emitter 1. Overall device firing times, however, are shortest when edge 10 and line 11 are oriented parallel to one of the crystallographic axes as shown in FIG. 1.

Figure 4:
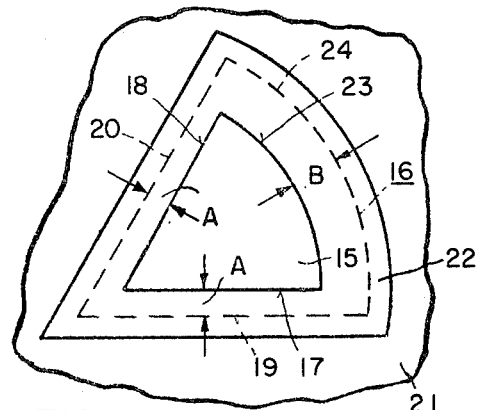
FIG. 4 is a partial plan view of a second embodiment of the present invention.

FIG. 4 illustrates a second embodiment of the invention wherein the control electrode 15 has the shape of a sector of a circle, defined by two straight edges 17 and 18 and a curved edge 23. The edges 17 and 18 subtend an angle of 60°. In similar orientation to control electrode 15, the auxiliary emitter 22 forms a PN junction interface 16 at the surface of the semiconductor body, the interface 16 defining a sector of a circle surrounding the control electrode 15. The interface 16 consists of two straight line portions 19 and 20 and a curved line portion 24. A recess in auxiliary emitter electrode 21 forms a similarly oriented sector of a circle surrounding interface 16 and the control electrode 15.

The parallel edge 17 and line 19 are separated by a distance designated by A. Likewise the parallel edges 18 and line 20 are separated by the same distance A. A distance B, which is greater than the distance A, separates the curved edge 23 and curved line 24.

In the embodiment of FIG. 4, uniform firing takes place along lines 19 and 20 at the portions of lines 19 and 20 separated from the control electrode 15 by the distance A. The angle of 60° between the straight edges and lines of the sectors is chosen since the crystallographic axes (as shown in FIG. 1) likewise intersect at an angle of 60° for a semiconductor crystal drawn in the <111> direction.

Figure 5:
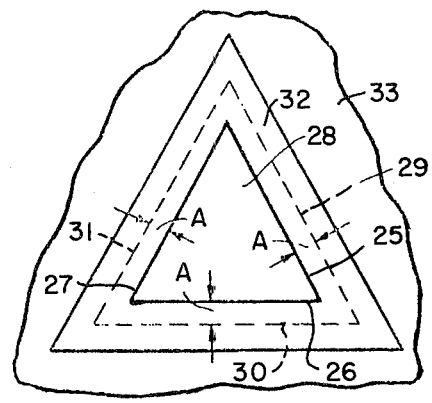
FIG. 5 is a partial plan view of a third embodiment of the present invention.

FIG. 5 illustrates a third embodiment of the invention wherein the edges 25, 26 and 27 of the control electrode 28 form an equilateral triangle lying within a second similarly oriented equilateral triangle formed by lines 29, 30 and 31 of the auxiliary emitter 32. A third similarly oriented equilateral triangle is formed by a recess in the auxiliary emitter electrode 33 lying outside the first and second triangles.

The parallel sets of edges and lines (25–29, 26–30, and 27–31) are separated by the same distance A. Uniform firing takes place along lines 29, 30 and 31 at the portions of the lines separated from the control electrode 28 by the distance A.

What is claimed is:

1. A semiconductor switching device comprising a body of semiconductor material, said body comprising a substantially flat top surface, an emitter zone of a first type of semiconductivity, a base zone of a second type of semiconductivity adjacent to said emitter zone, said zones sharing a portion of said flat top surface, a PN junction at the interface between said zones, said PN junction interface having a portion forming a straight line along said flat top surface, said straight line lying parallel to a crystallographic direction of [110], said device further comprising an emitter electrode and a control electrode each disposed on said flat top surface, said emitter electrode contacting said emitter zone, said emitter electrode having a straight edge spaced from and parallel to said straight line, said control electrode contacting said base zone, said control electrode having a straight edge spaced from and parallel to said straight line, whereby the shortest separation distance between said control electrode and said emitter zone is the separation distance between said straight edge of said control electrode and said straight line.

2. A semiconductor switching device in accordance with claim 1 wherein a second portion of said PN junction interface is a semicircle, and said control electrode is generally rectangular in shape lying within the semicircle.

3. A semiconductor switching device in accordance with claim 1 wherein the intersection of said PN junction interface with said surface forms a first sector of a circle, said control electrode forms a similarly shaped second sector of a circle lying within said first sector, said sectors positioned with their respective radii in parallel and separated by an equal distance, said sectors having their arcs separated by a second distance, such that said second distance is greater than said equal distance.

4. A semiconductor switching device in accordance with claim 3 wherein each of said arcs subtends an angle of 60°.

5. A semiconductor switching device in accordance with claim 1 wherein the intersection of said PN junction interface with said surface forms a first equilateral triangle, said control electrode forms a second equilateral triangle lying within said first triangle, said emitter electrode has an opening, said opening forms a third equilateral triangle lying outside of said first and second triangles, said triangles having their respective legs in parallel, said respective legs of said first and second triangles being separated by a first equal distance, and said respective legs of said second and third triangles being separated by a second equal distance.

* * * * *